United States Patent [19]

Nakahata et al.

[11] Patent Number: 4,528,634
[45] Date of Patent: Jul. 9, 1985

[54] BIT PATTERN GENERATOR

[75] Inventors: Kozo Nakahata; Ikuo Kawaguchi, both of Yokohama; Kazuo Yamaguchi, Sagamihara, all of Japan

[73] Assignee: Hitachi, Ltd., Tokyo, Japan

[21] Appl. No.: 433,405

[22] Filed: Oct. 8, 1982

[30] Foreign Application Priority Data

Oct. 9, 1981 [JP] Japan .................................. 56-160173

[51] Int. Cl.³ ............................................. G06F 15/40
[52] U.S. Cl. .................................... 364/491; 364/490; 364/518
[58] Field of Search ............... 364/488, 489, 490, 491, 364/518

[56] References Cited

U.S. PATENT DOCUMENTS

| 4,218,142 | 8/1980 | Kryger et al. | 364/552 X |
| 4,280,186 | 7/1981 | Hidai et al. | 364/518 |
| 4,377,849 | 3/1983 | Finger et al. | 364/491 |
| 4,433,384 | 2/1984 | Berrian et al. | 364/490 X |
| 4,482,810 | 11/1984 | Cooke | 364/491 X |

Primary Examiner—Errol A. Krass
Assistant Examiner—Edward R. Cosimano
Attorney, Agent, or Firm—Antonelli, Terry & Wands

[57] ABSTRACT

A bit pattern generator includes two memories which are provided for storing a bit pattern for a scanning line produced from design data. When a bit pattern is created and stored in one of the memories, the previously created and stored bit pattern is read out from the other memory. For the creation of each bit pattern, a scanning line is divided into a plurality of bytes. Model patterns of bit patterns existing in the respective bytes are stored in a ROM. From the combination of start point and end point addresses specifying the byte positions and the ROM addresses, a ROM address for each byte is logically determined so that any model patterns in the ROM are sequentially stored in the first mentioned memories.

6 Claims, 12 Drawing Figures

FIG. I
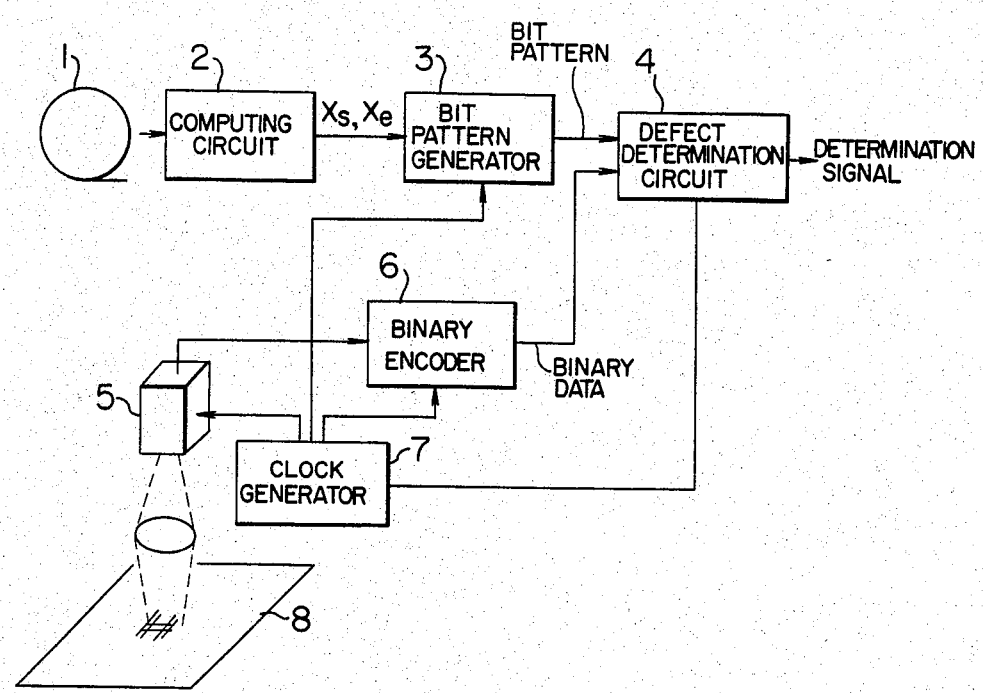
FIG. 2
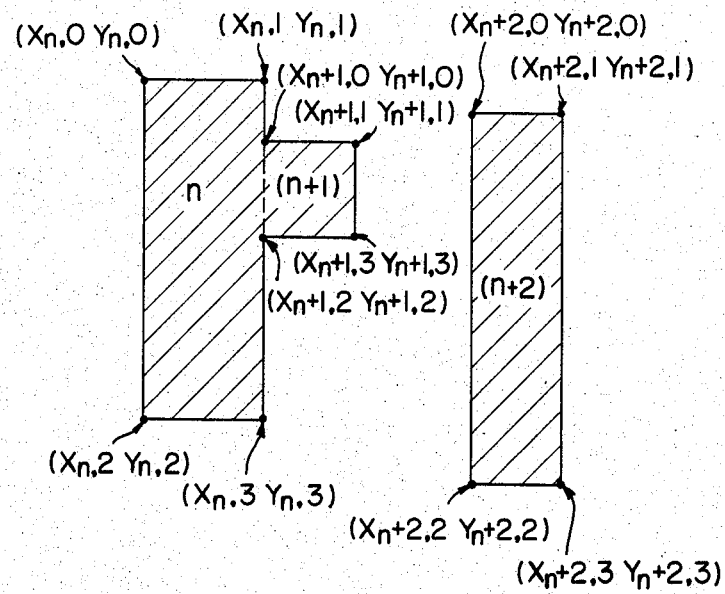

FIG. 3

|   | j=0 | 1 | 2 | 3 | 4 | 5 | 6 | 7 | 8 | 9 | 10 | 11 | 12 | 13 | 14 | 15 | 16 | 17 | - - - - - |
|---|---|---|---|---|---|---|---|---|---|---|---|---|---|---|---|---|---|---|---|
| i=0 | 0 | 0 | 0 | 0 | 0 | 0 | 0 | 0 | 0 | 0 | 0 | 0 | 0 | 0 | 0 | 0 | 0 | 0 | |
| 1 | 0 | 0 | 0 | 1 | 1 | 1 | 1 | 0 | 0 | 0 | 0 | 0 | 0 | 0 | 0 | 0 | 0 | 0 | |
| 2 | 0 | 0 | 0 | 1 | 1 | 1 | 1 | 0 | 0 | 0 | 0 | 0 | 0 | 1 | 1 | 1 | 0 | 0 | |
| 3 | 0 | 0 | 0 | 1 | 1 | 1 | 1 | 1 | 1 | 0 | 0 | 0 | 0 | 1 | 1 | 1 | 0 | 0 | |
| 4 | 0 | 0 | 0 | 1 | 1 | 1 | 1 | 1 | 1 | 0 | 0 | 0 | 0 | 1 | 1 | 1 | 0 | 0 | |
| 5 | 0 | 0 | 0 | 1 | 1 | 1 | 1 | 1 | 1 | 0 | 0 | 0 | 0 | 1 | 1 | 1 | 0 | 0 | |

FIG. 7A

| $A_H$ \ $A_L$ | 0 | 1 | 2 | 3 | 4 | 5 | 6 | 7 |
|---|---|---|---|---|---|---|---|---|
| 0 | 0001 | | | | | | | |
| 1 | 0003 | 0002 | | | | | | |
| 2 | 0007 | 0006 | 0004 | | | | | |
| 3 | 000F | 000E | 000C | 0008 | | | | |
| 4 | 001F | 001E | 001C | 0018 | 0010 | | | |
| 5 | 003F | 003E | 003C | 0038 | 0030 | 0020 | | |
| 6 | 007F | 007E | 007C | 0078 | 0070 | 0060 | 0040 | |
| 7 | 00FF | 00FE | 00F8 | 00F8 | 00F0 | 00E0 | 00C0 | 0080 |
| 8 | 01FF | 01FE | 01FC | 01F8 | 01F0 | 01E0 | 01C0 | 0180 |
| 9 | 03FF | 03FE | 03FC | 03F8 | 03F0 | 03E0 | 03C0 | 0380 |
| A | 07FF | 07FE | 07FC | 07F8 | 07F0 | 07E0 | 07C0 | 0780 |
| B | 0FFF | 0FFE | 0FFC | 0FF8 | 0FF0 | 0FE0 | 0FC0 | 0F80 |
| C | 1FFF | 1FFE | 1FFC | 1FF8 | 1FF0 | 1FE0 | 1FC0 | 1F80 |
| D | 3FFF | 3FFE | 3FFC | 3FF8 | 3FF0 | 3FE0 | 3FC0 | 3F80 |
| E | 7FFF | 7FFE | 7FFC | 7FF8 | 7FF0 | 7FE0 | 7FC0 | 7F80 |
| F | FFFF | FFFE | FFFC | FFF8 | FFF0 | FFE0 | FFC0 | FF80 |

$A_L$ (LOW ADDRESS) IN HEXADECIMAL; $A_H$ (HIGH ADDRESS) IN HEXADECIMAL

FIG. 7B

| $A_H$ \ $A_L$ | 8 | 9 | A | B | C | D | E | F |
|---|---|---|---|---|---|---|---|---|
| 0 | | | | | | | | |
| 1 | | | | | | | | |
| 2 | | | | | | | | |
| 3 | | | | | | | | |
| 4 | | | | | | | | |
| 5 | | | | | | | | |
| 6 | | | | | | | | |
| 7 | | | | | | | | |
| 8 | 0100 | | | | | | | |
| 9 | 0300 | 0200 | | | | | | |
| A | 0700 | 0600 | 0400 | | | | | |
| B | 0F00 | 0E00 | 0C00 | 0800 | | | | |
| C | 1F00 | 1E00 | 1C00 | 1800 | 1000 | | | |
| D | 3F00 | 3E00 | 3C00 | 3800 | 3000 | 2000 | | |
| E | 7F00 | 7E00 | 7C00 | 7800 | 7000 | 6000 | 4000 | |
| F | FF00 | FE00 | FC00 | F800 | F000 | E000 | C000 | 8000 |

BIT PATTERN GENERATOR

BACKGROUND OF THE INVENTION

The present invention relates to a mask pattern checking system in which the presence or absence of pattern defects on a mask used for the exposure of patterns on wafers in fabricating semiconductor devices such as ICs and LSIs is checked through comparison with design data. The invention particularly relates to bit pattern generator in such a system for automatically generating bit patterns based on the design data.

FIG. 1 shows in block diagram a mask pattern checking system to which the present invention is applicable. The system comprises a memory 1 having stored design data, a computing circuit 2, a bit pattern generator 3, a defect determination circuit 4, a pattern detecting sensor 5, a binary encoder 6, a clock generator 7, and a mask 8 under test. The binary encoder 6 receives the output of the pattern detecting sensor 5 to provide binary data in the sequence of $i=0; j=0, 1, 2, \ldots, n: i=1; j=0, 1, 2, \ldots, n$: corresponding to the mask pattern image scanned by the pattern detecting sensor 5 as exemplified in FIG. 3. The bit pattern generator 3 generates reference patterns in synchronism with the output from the pattern detecting sensor 5 on the basis of the start point and end point addresses $X_{s1}, X_{e1}; X_{s2}, X_{e2}; \ldots; X_{sm}, X_{em}$ on the pattern existing coordinate j for each scanning line which addresses are produced by the calculation from apex coordinate date each pattern stored in the memory 1, as shown in FIG. 2.

As shown in FIG. 3, the conventional form of the bit pattern generator 4 comprises a number of pattern generator circuits $3_I-3_n$ which suffices for coordinate data $X_{s1}, X_{e1}; X_{s2}, X_{e2}; \ldots; X_{sm}, X_{em}$. Each pattern generator circuit includes latch circuits 10 and 11 for $X_s$ and $X_e$, comparators 12 and 13 for comparing latched data with the count $X_{ck}$ of a scanning address counter 15, and an AND gate 14 for producing a logical product between the outputs of the comparators 12 and 13. The bit pattern output from each of the generator circuits $3_I-3_n$ are generated through an OR gate 16 on a real time basis in synchronism with the scanning clock signal.

However, as the integration of semiconductor devices has advanced much higher recently, the number of data $X_s$ and $X_e$ to be processed by the bit pattern generator increases, resulting in a complex circuit arrangement including a large number (200-300 sets or more) of pattern generator circuits $3_I-3_n$. This also requires long wiring, causing problems of signal propagation time, and it is difficult to generate bit patterns at high speed in synchronism with the pattern detecting sensor.

SUMMARY OF THE INVENTION

An object of the present invention is to provide a bit pattern generator in which the above problems are eliminated and which can generate bit patterns, stably and at high speed, for a high density mask pattern.

In the present invention, two memories are provided for storing a bit pattern for a scanning line produced from design data. When a bit pattern is created and stored in one of the memories, the previously created and stored bit pattern is read out from the other memory. For the creation of each bit pattern, a scanning line is divided into a plurality of bytes. Model patterns of bit patterns existing in the respective bytes are stored in a ROM. From the combination of start point and end point addresses specifying the byte positions and the ROM addresses, a ROM address for each byte is logically determined so that any model patterns in the ROM are sequentially stored in the first mentioned memories.

BRIEF DESCRIPTION OF THE DRAWINGS

Preferred embodiments of the invention will be described referring to the accompanying drawings, in which:

FIG. 1 is a general block diagram of a mask pattern checking system to which the present invention is applicable;

FIG. 2 shows an example of design data of mask patterns supplied to the mask pattern checking system;

FIG. 3 shows an example of binary data provided from the binary encoder shown in FIG. 1.

FIGS. 7A and 7B show examples of a model pattern stored in the ROM shown in FIG. 5;

DESCRIPTION OF THE PREFERRED EMBODIMENTS

In the present invention, binary bit patterns are created in the following processes. A number of bits included in a single scanning line are divided into bytes having a fixed bit length and logical operations are sequentially performed for each byte. By the comparison with $X_{s1}$ and $X_{e1}$, one of model patterns preliminarily stored in the byte units in a ROM is selectively read out, and the selected model pattern is stored in a bit pattern creating memory. This procedure is carried out for all bytes, and the creation of a bit pattern for one of the data $X_{s1}$ and $X_{e1}$ is completed. Next, bit pattern data in a byte unit for $X_{s2}$ and $X_{e2}$ is generated and stored in the bit pattern creating memory while taking a logical sum with the previously stored bit pattern. Similarly, bit patterns for $X_{s3}, X_{e3}; \ldots; X_{sn}, X_{en}$ are sequentially stored to complete bit patterns for the entire single scanning line.

The division into bytes and the sequential logical operations for each byte are employed since the concurrent operations for all bits on a single scanning line needs a great amount of hardware although it takes a short total processing time. By reducing the number of bits constituting a byte as small as possible in consideration of the processing speed required for the system, hardware can be simplified, which is desirable for practicing the system.

Figure 4:
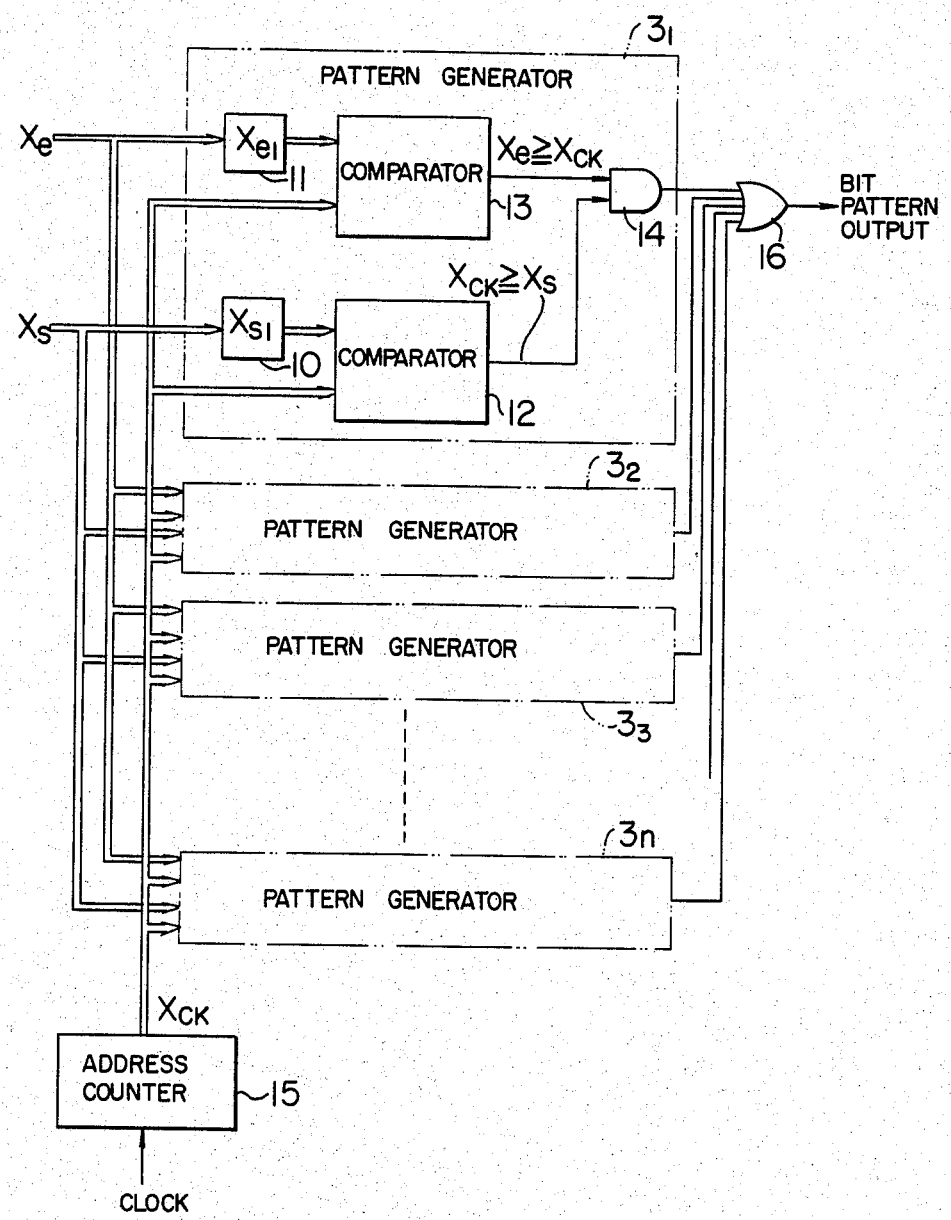
FIG. 4 is a block diagram showing the conventional bit pattern generator.
Figure 5:
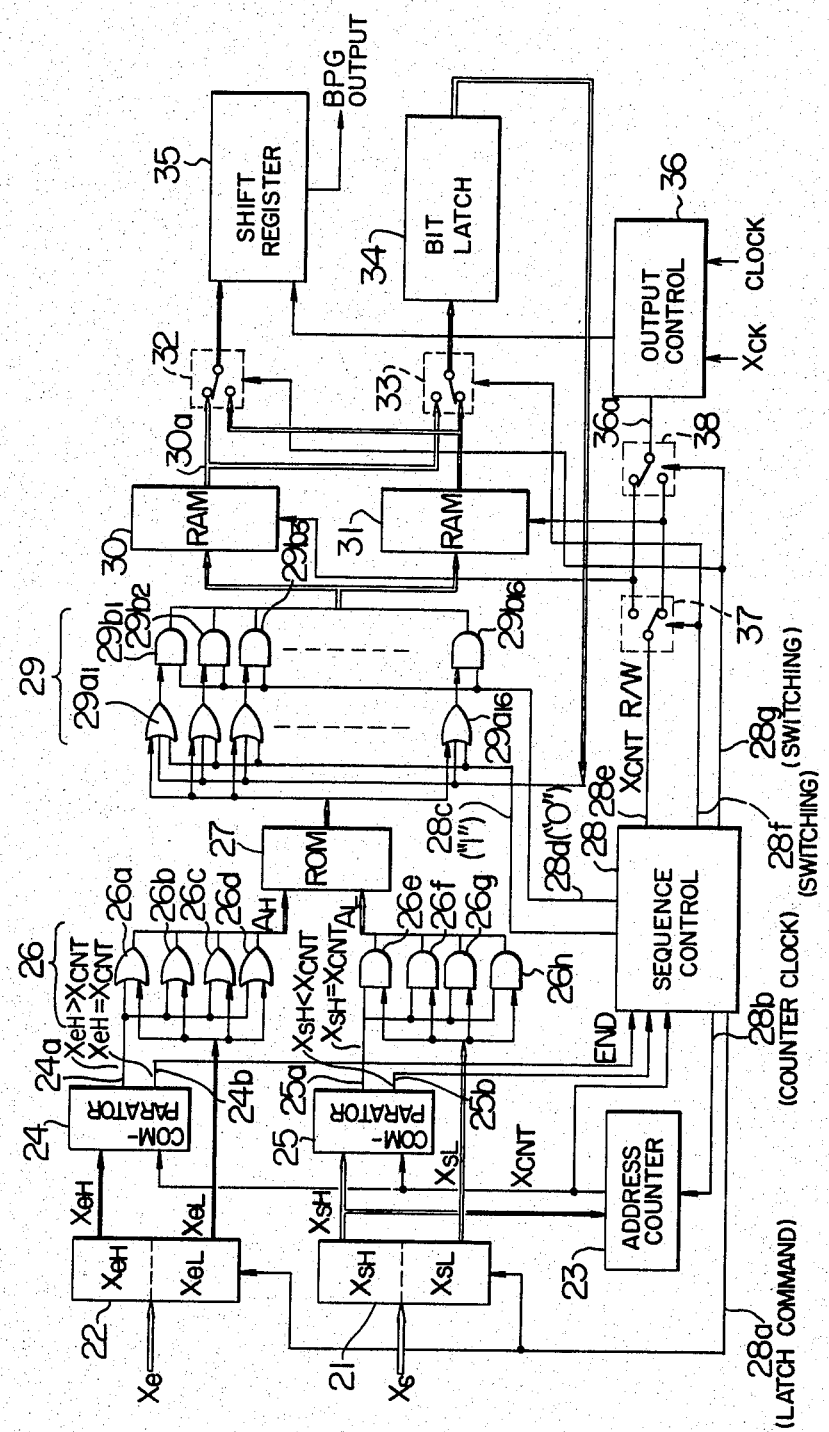
FIG. 5 is a block diagram showing a bit pattern generator according to an embodiment of the present invention.
Figure 6A:
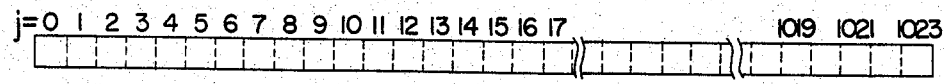
FIGS. 6A and 6B are illustrations showing the structure of a single scanning line.
Figure 6B:
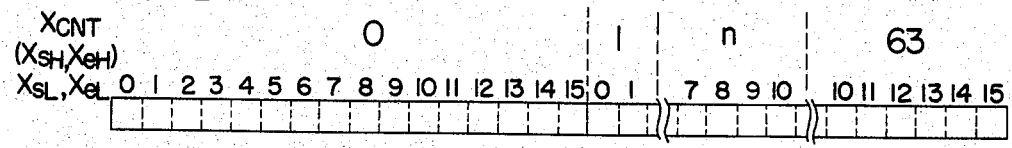

FIG. 5 is a block diagram showing a bit pattern generator according to an embodiment of the present invention. In this embodiment, a scanning line is composed of 1024 bits of picture elements, 16 bits form one byte and 64 bytes of bit patterns are generated. A bit pattern of 1024 bits for a single scanning line as shown in FIG. 6A is divided into bit patterns of 16 bits by 64 bytes as shown in FIG. 6B. Any bit among 1024 bits can be specified by designating a byte position or one of the divided positions 0–63 (hereinafter referred to byte address $X_{CNT}$) and a bit position within that byte (hereinafter referred to bit address). This may be achieved, for example, by designating start point and end point addresses $X_s$ and $X_e$ of a pattern in respective 10-bit binary numbers each of which includes higher or upper 6 bits assigned to a byte address $X_{sH}$ (or $X_{eH}$) and lower 4 bits assigned to a bit address $X_{sL}$ (or $X_{eL}$).

Individual components in the bit pattern generator shown in FIG. 5 will now be described in brief. Reference numeral 21 denotes a latch circuit for holding the above-mentioned 10-bit start point address $X_s$ (byte address $X_{sH}$ and bit address $X_{sL}$), and numeral 22 is a latch circuit for holding the 10-bit end point address $X_e$ (byte address $X_{eH}$ and bit address $X_{eL}$). Numeral 23 is an address counter for counting the byte address. Numeral 24 is a comparator for comparing the byte address $X_{eH}$ in the latch circuit 22 with the count of the address counter 23, and numeral 25 is a comparator for comparing the byte address $X_{sH}$ in the latch circuit 21 with the count of the address counter 23. Numeral 26 is an end point/start point bit address calculator which generates address signals $A_H$ and $A_L$ for a ROM 27 based on the bit address $X_{eL}$ in the latch circuit 22 and the bit address $X_{sL}$ in the latch circuit 21. 16-bit model patterns as shown in FIGS. 7A and 7B are stored in the ROM 27. Any model pattern is read out from the ROM 27 in accordance with the address signals $A_H$ and $A_L$. Numeral 28 is a sequence control circuit which provides a latch command signal to the latch circuits 21 and 22, a counter clock signal to the address counter 23, a "0" or "1" data production command to a gate circuit 29, switching signals to four switching circuits 32, 33, 37 and 38, and an $X_{CNT}$ signal to RAMs 30 and 31. Each of the RAMs 30 and 31 has a capacity of one scanning line (16 bits × 64 bytes = 1024 bits). Each of the switching circuits 32 and 33 is changed over for every scanning line in response to the switching signal sequence control circuit 28. Numeral 34 is a bit latch circuit which contributes to the pattern creation to feed back, data of the RAM 31 (or 30) supplied through the switching circuit 33, to the gate circuit 29. Numeral 35 is a shift register which receives data of the RAM 30 (or 31) through the switching circuit 32 in a parallel (e.g. bit-parallel) fashion and outputs the data in a serial fashion. Numeral 36 is an output control circuit for supplying a clock signal to the shift register 35. The switching circuit 37 is changed over by the sequence control circuit 28 and it controls the (writing or reading) operations of the RAMs 30 and 31. The switching circuit 37 provides the byte address $X_{CNT}$ for the RAM in a writing mode. The switching circuit 38 is changed over by the sequence control circuit 28 and supplies the clock from the output control circuit 36 to the RAM in a reading mode.

In operation, the writing and reading operations of the paired RAMs 30 and 31 are controlled for every scanning line. The switch positions in the four switching circuits 32, 33, 37 and 38 shown in FIG. 5 indicate the case where the RAM 30 is in a reading mode while the RAM 31 is in a writing mode. Accordingly, the RAM 30 is controlled for reading by the clock 36a supplied from the output control circuit 36 through the switching circuit 38 to provide the RAM output 30a to the shift register 35 through the switching circuit 32. On the other hand, the RAM 31 is controlled for writing by the output 28e from the sequence control circuit 28 through the switching circuit 37 to supply a part of the created pattern through the switching circuit 33 to the bit latch circuit 34. The following will describe primarily the writing of data in the RAM 31.

Figure 8:
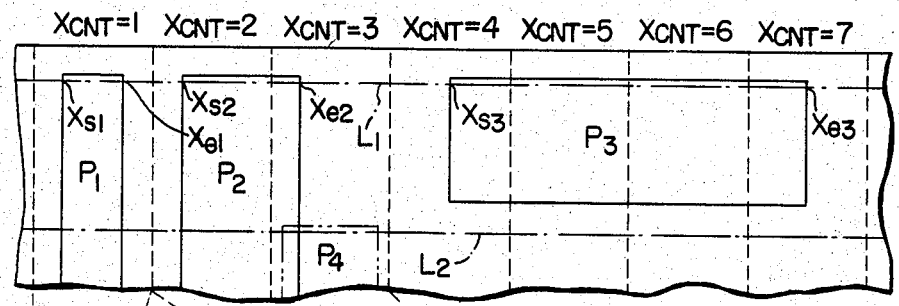
FIG. 8 shows examples of design data of preliminarily prepared patterns.

As mentioned previously, a scanning line of 1024 bits is divided into 64 bytes for generating a bit pattern. Accordingly, there are three forms in which the start point and end point addresses $X_s$ and $X_e$ on a scanning line, as shown in FIG. 8. A first form is the case where both $X_s$ and $X_e$ exist within a single byte address, as shown by a pattern $P_1$. A second form is the case where $X_s$ and $X_e$ exist over two adjacent byte addresses, as shown by a pattern $P_2$. A third form is the case where $X_s$ and $X_e$ exist over three or more than byte addresses, as shown by a pattern $P_3$. Description of bit pattern generation will proceed following the three cases.

The creation of pattern data starts by supplying the "0" data production command 28d from the sequence control circuit 28 to sixteen AND gates $29b1$–$29b16$ in the gate circuit 29 so that all bits of the RAM 31 are reset to "0"s. The present invention is based on the conventional that all bits of the RAM are initially reset to "0"s and portions where patterns as shown in FIG. 8 exist are then set to "1"s. This intends to reduce a time for logical operation, since it is obvious that bit patterns are included only in bytes between $X_{sH}$ and $X_{eH}$ and hence it is only required that the generation of bit patterns is made for bytes in the range of $X_{sH} \leq X_{CNT} \leq X_{eH}$.

The start point and end point addresses of the three patterns $P_1$, $P_2$ and $P_3$ on a scanning line $L_1$ shown in FIG. 8 are termed $X_{s1}$, $X_{e1}$; $X_{s2}$, $X_{e2}$; and $X_{s3}$, $X_{e3}$, respectively, and they are given in 10-bit binary numbers as follows:

$X_{s1} = 0000010100$ ($X_{s1H} = 1$, $X_{s1L} = 4$)

$X_{e1} = 0000011100$ ($X_{e1H} = 1$, $X_{e1L} = C(12)$)

$X_{s2} = 0000100100$ ($X_{s2H} = 2$, $X_{s2L} = 4$)

$X_{e2} = 0000110100$ ($X_{e2H} = 3$, $X_{e2L} = 4$)

$X_{s3} = 0001001000$ ($X_{s3H} = 4$, $X_{s3L} = 8$)

$X_{e3} = 0001111000$ ($X_{e3H} = 7$, $X_{e3L} = 8$)

In the parentheses are shown the byte and bit addresses $X_{sH}$ ana $X_{sL}$ or $X_{eH}$ and $X_{eL}$ for each start point or end point address $X_s$ or $X_e$ in 64's and hexadecimal notations.

After all bits of the RAM 31 have been initially reset to "0"s, as mentioned above, the start point and end point addresses $X_{s1}$ and $X_{e1}$ of the pattern $P_1$ are inputted to the respective latch circuits 21 and 22 by the latch command signal 28a issued from the sequence control circuit 28. The latch circuit 21 sends the higher 6 bits $X_{sH}$ of $X_{s1}$, which will be a logical operation starting byte address, to the byte address counter 23 which controls or supervises a byte address at which the logical operation is being performed. The output $X_{CNT}$ of the address counter 23 is fed through the sequence control circuit 28 and the switching circuit 37 to the RAM 31 to designate the location of writing therein. The $X_{CNT}$ is also delivered to the comparators 25 and 24 so that it is compared with the byte address $X_{s1H}$ of $X_{s1}$ and the byte address $X_{e1H}$ of $X_{e1}$, respectively. Since a part of a byte data satisfying $X_{CNT} = X_{sH}$ or $X_{CNT} = X_{eH}$ forms a bit pattern, the end point and start point addresses $A_H$ and $A_L$ of the pattern determined by the lower 4 bit $X_{sL}$ and $X_{eL}$ of $X_s$ and $X_e$ are produced by the end point/start point bit address calculator 26 as address signals for the ROM 27 from which a necessary pattern is in turn generated. The ROM 27 has preliminarily stored 16-bit model patterns as shown in FIGS. 7A and 7B, and the contents of the ROM 27 corresponding to the address signals are read out and delivered as a 16-bit pattern.

Explanation will now be made of the results of comparison by the comparators 24 and 25 and the logical operations by the end point/start point bit address calculator 26. In the comparator 25, $X_{CNT}=X_{s1H}$ is satisfied so that the output 25a being a high level is applied to first inputs of four AND gates 26e–26h. Second inputs of the AND gates 26e–26h are applied with the bit address $X_{s1L}$ of the start point address $X_{s1}$ from the latch circuit 21. As a result, these AND gates provide "4" (hexadecimal) as the address signal $A_L$. On the other hand, in the comparator 24, $X_{CNT}=X_{e1H}$ is satisfied so that the output 24a being a low level is applied to first inputs of four OR gates 26a–26d. The output 24b is in a high level. Second inputs of the OR gates 26a–26d are applied with the bit address $X_{e1L}$ of the end point address $X_{e1}$ from the latch circuit 22. As a result, these OR gates provide "C" (hexadecimal) as the address signal $A_H$.

Figure 9A:
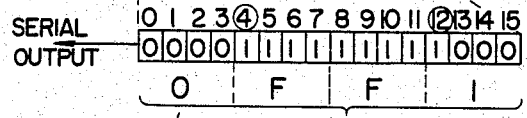
FIGS. 9A and 9B are charts explaining the operational processes performed in the disclosed embodiment.

The address signals $A_L$ (=4) and $A_H$ (=C) for the ROM 27 are thus calculated and a model bit pattern of "1FF0" shown in FIG. 9A is read out from the ROM 27. This bit pattern is delivered to the RAM 31 through the gate circuit 29 including sixteen OR gates 29a1-2-9a16 and sixteen AND gates 29b1–29b16, and stored in a location thereof specified by $X_{CNT}=1$. Since the inputs of the AND gates 29b1–29b16 connected to from the sequence control circuit 28 are rendered to low levels after the initial "0" data has been created, the output of the ROM 27 can pass through these AND gates.

The output 24b of the comparator 24 takes a high level when $X_{CNT}=X_{e1H}$, as mentioned above, and this output 24b is applied to the sequence control circuit 28 as an END signal indicating the termination of a logical operation specified by $X_{s1}$ and $X_{e1}$. Upon receipt of the END signal, the sequence control circuit 28 issues a latch command signal 28a so that the latch circuits 21 and 22 take in the start point and end point addresses $X_{s2}$ and $X_{e2}$ for the pattern $P_2$.

The following will describe the generation of bit pattern $P_2$ which is shared by two bytes as shown in FIG. 8. First, the address counter provides its output $X_{CNT}$ being $X_{s2H}$ held in the latch circuit 21, thereby designating the writing location of the RAM 31 through the sequence control circuit 28 and the switching circuit 37 in the same manner as mentioned previously. In the comparator 25, $X_{CNT}=X_{s2H}$ is satisfied so that the output 25a takes a high level. Therefore, the AND gates 26e–26h provide the address signal $A_L=$"4" (hexadecimal) in accordance with the bit address $X_{s2L}$ of the start point address $X_{s2}$. On the other hand, a relation between the byte address $X_{e2H}$ ("3" in 64's notation) of the end point address $X_{e2}$ and the $X_{CNT}$ ("2" in 64's notation) of the address counter 23 in the comparator 24 is as follows:

$$X_{e2H} > X_{CNT}$$

Figure 9B:
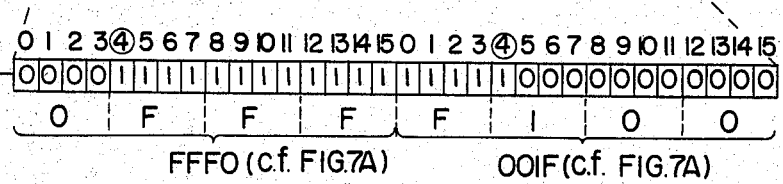

Accordingly, the output 24a of the comparator 24 takes a high level so that the OR gates 26a–26d having the first inputs connected to the comparator output 24a provide an output $A_H=$"F" (hexadecimal) irrespective of the second inputs thereof. As a result, the address signals $A_L=4$ and $A_H=F$ are fed to the ROM 27 from which a model pattern of "FFF0" in the pattern table shown in FIG. 7A or a pattern shown on the left side of FIG. 9B is in turn read out. This pattern is delivered through the gate circuit 29 to the RAM 31 and stored in a location thereof designated by $X_{CNT}=2$.

In the previous description for the generating of the pattern $P_1$, it has been mentioned that the logical operation specified by the start point and end point addresses $X_s$ and $X_e$ terminates when a condition of $X_{eH}=X_{CNT}$ is met. However, the logical operation will proceed if that condition is not met, and the sequence control circuit 28 produces a counter clock 28b by detecting, for example, the absence of an END signal so that the byte address counter 25 is incremented. Now, the address counter 23 provides $X_{CNT}=3$. Therefore, the writing location of the RAM 31 is correspondingly changed.

In the comparator 25, a relation between the byte address $X_{s2H}$ ("2" in 64's notation) of the start point address $X_{s2}$ and the $X_{CNT}$ (=3) of the address counter 23 is as follows:

$$X_{s2H} < X_{CNT}$$

Accordingly, the output 25a of the comparator 25 takes a low level so that the AND gates 26e–26h having the first inputs connected to the comparator output 25a provide an output $A_L=0$ (hexadecimal) irrespective of the second inputs thereof. On the other hand in the comparator 25, $X_{e2H}=X_{CNT}=3$ is satisfied so that the output 24a takes a low level. Therefore, the OR gates 26a–26d provide an address signal $A_H=$"4" (hexadecimal) in accordance with the bit address $X_{e2L}$ of the end point address $X_{e2}$. As a result, the address signals $A_L=0$ and $A_H=4$ are fed to the ROM 27 from which a model pattern of "001F" in the pattern table shown in FIG. 7A or a pattern shown on the right side of FIG. 9B is in turn read out. This pattern is delivered through the gate circuit 29 to the RAM 31 and stored in a location thereof designated by $X_{CNT}=3$.

The comparator 24 satisfies $X_{e2H}=X_{CNT}=3$, providing at its output 24b an END signal to the sequence control circuit 28. Then, logical operations are turned to the subsequent patterns $P_3, P_4, \ldots$.

Finally, the generation of bit pattern $P_3$ in FIG. 8 will be described. In this case, logical operations for poprtions $X_{CNT}=4$ and $X_{CNT}=7$ are the same as those for $X_{CNT}=2$ and $X_{CNT}=3$. Therefore, explanation thereof will be omitted.

For the generation of pattern $P_3$, it is noted that conditions of $$X_{s3H} < X_{CNT} \text{ and } X_{CNT} < X_{e3H}$$

are met in the byte portions of $X_{CNT}=5$ and $X_{CNT}=6$. However, even in these cases, a bit pattern in which all bits in a byte are "1" can be generated by use of the comparators 24 and 25 and the end point/start point bit address calculator 26. This is because the output 25a of the comparator 25 takes a low level to make an address signal $A_L=0$ and the output 24a of the comparator 24 takes a high level to make an address signal $A_H=F$, thereby providing a model pattern of "FFFF" as shown in FIG. 7A. However, it is undesirably a waste of computation time to access the ROM 27 each time when $X_{sH} < X_{CNT} < X_{eH}$ is met, notwithstanding that the ROM 27 always provides a model pattern of "FFFF" in such cases. The longer the pattern P₃ as shown in FIG. 8 in the lateral direction, the longer will be the waste time. The present embodiment considers a fact that the condition of $X_{sH} < X_{CNT}$ can be detected from a high level in the output 25b of the comparator 25 and the condition of $X_{CNT} < X_{eH}$ can be detected from a high level in the output 24a of the comparator 24 or a low level in output 24b thereof (i.e., the absence of an END signal) due to the nature of the end point address $X_e$. Then, the sequence control circuit 28 issues on its output 28c a "1" data production command to the OR gates 29a1–29a16 in the gate circuit 29 when the circuit 28 detects a high level in the comparator output 25b and a low level in the comparator output 24b. This operation is repeated while incrementing the address counter 23, whereby a time for logical operations in the gate circuit 26 and a time for access to the ROM 27 can be saved.

With the foregoing operations, bit patterns are stored in the entire area of the RAM 31.

Although in FIG. 8 the patterns P₁, P₂ and P₃ are separated from each other, there can exist a pattern P₄, as shown by the double-dot and dash line in FIG. 8, which partly overlaps on another pattern (P₂). In consideration of such a case, the present embodiment is further provided with the bit latch circuit 34.

A portion of the pattern P₂ on a scanning line L₂ is stored in locations of in the RAM corresponding to $X_{CNT}=2$ and $X_{CNT}=3$, in the same manner as mentioned previously. In storing the pattern P₄ in the location of $X_{CNT}=3$ in the RAM, data previously stored in the $X_{CNT}=3$ is once retrieved to the latch circuit 34, a logical sum thereof with the ROM contents is produced by the OR gates 29a1–29a16, and then the result is stored in the same RAM location. This procedure allows not only twofold patterns but patterns of threefold or more can also be treated.

Thus, the storing of data to one (RAM 31 in the explained example) of the RAMs 30 and 31 is completed. While a bit pattern is created in the RAM 31, the RAM 30 outputs a bit pattern which has been created. In the next scanning period, the RAM 31 outputs the created bit pattern while a bit pattern is created and stored in the RAM 30. These repetitive operations are switched by the switching circuits 32 and 33 so that bit patterns are produced on a real time basis.

In outputting the bit patterns, the output control circuit 36 operates so that the RAM (30 or 31 selected for output) transfers the created 16-bit bit pattern to the shift register 35 which in turn delivers the bit pattern in a bit-serial fashion in response to the external clock.

As described above, the present invention allows the real time generation of bit patterns for a high density mask pattern at high speed while employing a simple circuit arrangement including the ROM 27 of a small capacity resulting in the achievement of higher economy, higher processing speed and higher stability of performance as compared with prior art generator.

It should be noted that blank portions of the tables in FIGS. 7A and 7B are unused portions of the memory, and the memory contents are expressed in hexadecimal notation. Addresses A, B, C, D, E and F are 10, 11, 12, 13, 14 and 15 in decimal.

We claim:

1. A bit pattern generator for generating, bit patterns of n bytes each including m bits, on the basis of a plurality of sets of pattern information each of which includes a start point address $X_s$ having a start point byte address $X_{sH}$ and a start point bit address $X_{sL}$ and an end point address $X_e$ having an end point byte address $X_{eH}$ and an end point bit address $X_{eL}$, comprising:

a ROM having preliminarily stored model patterns in byte units any one of which is read out therefrom by designating a pair of address signals $A_L$ and $A_H$;

a first latch circuit for holding said start point address $X_s$ and providing said start point byte address $X_{sH}$ and said start point bit address $X_{sL}$ at its first and second outputs, respectively;

a second latch circuit holding said end point address $X_e$ and providing said end point byte address $X_{eH}$ and said end point bit address $X_{eL}$ at its first and second outputs, respectively;

an address counter for receiving said start point byte address $X_{sH}$ from said first latch circuit to provide a byte address $X_{CNT}$;

logical operation means which receives said start point byte address $X_{sH}$ and said start point bit address $X_{sL}$ from said first latch circuit, said end point byte address $X_{eH}$ and said end point bit address $X_{eL}$ from said second latch circuit, and said byte address $X_{CNT}$ from said address counter to produce an output representative of a comparison between $X_{eH}$ and $X_{CNT}$ and logical operation outputs representative of said pair of address signals $A_L$ and $A_H$, said address signals $A_L$ and $A_H$ being supplied to said ROM;

a sequence control circuit for receiving the comparison output from said logical operation means to increment said address counter when $X_{eH} \neq X_{CNT}$;

RAM means having a storage area of at least m bits by n bytes, the writing position to said RAM means being controlled by the byte address from said address counter; and a gate circuit located between said ROM and said RAM means for writing the output of said ROM into said RAM means.

2. A bit pattern generator according to claim 1, wherein said sequence control circuit operates to provide "0" data to said gate circuit prior to an writing operation to said RAM means so that "0"s are initially stored in the entire storage area of said RAM means.

3. A bit pattern generator according to claim 1, wherein said RAM means includes a pair of RAMs the writing and reading operations of which are alternately controlled by said sequence control circuit.

4. A bit pattern generator according to claim 3, wherein the RAM in a writing mode is connected at its output to a bit latch circuit, and the output of said bit latch circuit being supplied to said gate circuit to produce a logical sum with the output of said ROM.

5. A bit pattern generator according to claim 1, wherein said logical operation means includes a first comparator for comparing said byte address $X_{CNT}$ from said address counter and start point byte address $X_{sH}$ from said first latch circuit to provide an output indicative of $X_{sH}=X_{CNT}$ and an output representative of $X_{sH}<X_{CNT}$, a second comparator for comparing said byte address $X_{CNT}$ from said address counter and said end point byte address $X_{eH}$ from said second latch circuit to provide an output indicative of $X_{eH}>X_{CNT}$ and an output indicative of $X_{eH}=X_{CNT}$, a set of AND gates for providing the start point bit address $X_{sL}$ from said first latch circuit as the address signal $A_L$ when said first comparator provides the $X_{sH}=X_{CNT}$ output and for providing "0"s as the address signal $A_L$ when said first comparator provides the $X_{sH}<X_{CNT}$ output, and a set of OR gates for providing "F"s as the address signal $A_H$ when said second comparator provides the $X_{eH}>X_{CNT}$ output and for providing the end point bit address $X_{eL}$ from said second latch circuit as the address signal $A_H$ when said second comparator provides the $X_{eH}=X_{CNT}$ output.

6. A bit pattern generator according to claim 5, wherein said sequence control circuit is applied with the $X_{sH}<X_{CNT}$ output from said first comparator and the $X_{eH}>X_{CNT}$ output from said second comparator to provide "FFFF" data to said gates when a relation of $X_{SH}<X_{CNT}<X_{eH}$ is satisfied.

* * * * *